United States Patent
Tseng et al.

(10) Patent No.: US 7,605,783 B2
(45) Date of Patent: Oct. 20, 2009

(54) DRIVING CIRCUIT OF LIGHT EMITTING ELEMENT

(75) Inventors: Huai-Yuan Tseng, Pingzhen (TW); Yung-Hui Yeh, Hsinchu (TW)

(73) Assignee: Industrial Technology Research Institute, HsinChu (TW)

( * ) Notice: Subject to any disclaimer, the term of this patent is extended or adjusted under 35 U.S.C. 154(b) by 822 days.

(21) Appl. No.: 11/138,349

(22) Filed: May 27, 2005

(65) Prior Publication Data

US 2006/0181486 A1    Aug. 17, 2006

(30) Foreign Application Priority Data

Feb. 16, 2005    (TW) .............................. 94104385 A

(51) Int. Cl.
*G09G 3/32*    (2006.01)
(52) U.S. Cl. .............................. 345/82; 345/76; 345/84
(58) Field of Classification Search ............. 345/44–46, 345/76, 82, 90–92, 204, 55; 315/161.1, 169.3; 257/290–291; 250/552; 313/500
See application file for complete search history.

(56) References Cited

U.S. PATENT DOCUMENTS

| | | | | |
|---|---|---|---|---|
| 6,137,553 | A * | 10/2000 | Izumi et al. .................... | 349/49 |
| 6,738,031 | B2 * | 5/2004 | Young et al. .................... | 345/55 |
| 6,900,497 | B2 * | 5/2005 | Agarwal et al. ............. | 257/306 |
| 7,119,781 | B2 * | 10/2006 | Yu .............................. | 345/98 |
| 7,285,900 | B2 * | 10/2007 | Yang et al. .................... | 313/495 |
| 7,443,391 | B2 * | 10/2008 | Yoneyama ................... | 345/213 |

FOREIGN PATENT DOCUMENTS

| | | |
|---|---|---|
| TW | 489512 | 6/2002 |
| TW | 558699 | 10/2003 |
| TW | 569461 | 1/2004 |

\* cited by examiner

*Primary Examiner*—Abbas I Abdulselam
(74) *Attorney, Agent, or Firm*—WPAT, PC; Justin I. King

(57) ABSTRACT

A driving circuit for a light emitting element, electrically connected to a data line and a scan line and powered by a bias voltage so as to drive the light emitting element, comprising: a first transistor, further comprising: a first gate, electrically connected to the scan line; and a first drain/source, having a first node electrically connected to the data line and a second node; and a second transistor, further comprising: a second gate, electrically connected to the second node of the first drain/source; and a second drain/source, having a first node electrically connected to the bias voltage, and a second node electrically connected to the light emitting element; wherein, an insulation layer and a layer of non-volatile material is formed successively between the semiconductor layer and the second gate of the second transistor.

14 Claims, 4 Drawing Sheets

DRIVING CIRCUIT OF LIGHT EMITTING ELEMENT

FIELD OF THE INVENTION

The present invention relates to driving circuit of light emitting element, and more particularly, to a non-volatile driving circuit for driving light emitting elements.

BACKGROUND OF THE INVENTION

As the rapid advance of technology propelling the development of electronic related industry, electronic products had become more and more intimate to our daily life, which is especially true to computers. No matter it is a desktop computer, or is a notebook computer, both require to use displays for showing information to users thereof. Hence, without notice, displays have become the electronic products that are used almost all the time in our modern life.

As displays have becoming more and more closely related to our lives, the electronic related industry feels the need of optimizing the performance of displays so as to provide a more competitive and user friendly electronic product to the consumers. Among all the design for optimizing the performance of displays, power-saving is always am importance issue because of the dramatic increase of environmental awareness.

FIG. 1 shows a driving circuit of a light emitting element according to prior arts. In FIG. 1, the driving circuit 1 is electrically connected to a data line and a scan line, that is powered by a bias voltage $V_{DD}$ so as to drive a light emitting element 2. The driving circuit 1 further comprises two transistor $T_1$, $T_2$, and a capacitor $C_1$, wherein the gate 14 of the transistor $T_1$ is electrically connected to the scan line while a node 10 of the drain/source of the transistor $T_1$ is electrically connected to the data line, the gate 24 of the transistor $T_2$ is electrically connected to another node 12 of the drain/source of the transistor $T_1$ while a node 22 of the drain/source of the transistor $T_2$ is electrically connected to the bias voltage $V_{DD}$ and another node 20 thereof is electrically connected to the light emitting element 2. Moreover, a terminal 16 of the capacitor $C_1$ is electrically connected to the $V_{DD}$ while another terminal 18 thereof is electrically connected to the node 12 and the gate 24 in respective.

However, there are several shortcomings while the prior-art driving circuit for used for displaying a static image, which are list as following:

(1) signals of the data line are still being inputted all the while;
(2) data line are driven to switch on and off repetitively;
(3) scan line are driven to operate repetitively; and
(4) electricity waste are caused.

Therefore, it is in great need to have an improved driving circuit that can function without the abovementioned shortcomings.

SUMMARY OF THE INVENTION

It is the primary object of the invention to provide a driving circuit for a light emitting element, comprising a storage capacitor made of non-volatile material, which is capable of utilizing the hysteresis effect of the non-volatile material to reduce the amount of times that the data line and the scan line being driven to switch on/off during displaying a static image and thus reduce power consumption.

It is another object of the invention to provide a driving circuit for a light emitting element, comprising transistors made of non-volatile material, which utilizes the hysteresis effect of the non-volatile material instead of the operation of capacitors to reduce the amount of times that the data line and the scan line being driven to switch on/off during displaying a static image, such that no only power consumption is reduced, but also the aperture ratio of the display driven by the referring driving circuit can be increased and thus the displayed image quality is enhanced.

To achieve the above objects, the present invention provides a driving circuit for a light emitting element, electrically connected to a data line and a scan line and powered by a bias voltage so as to drive the light emitting element, comprising:

a first transistor, further comprising: a first gate, electrically connected to the scan line; and a first drain/source, having a first node electrically connected to the data line and a second node;

a second transistor, further comprising: a second gate, electrically connected to the second node of the first drain/source; and a second drain/source, having a first node electrically connected to the bias voltage, and a second node electrically connected to the light emitting element; and a capacitor, made of a non-volatile material, having two terminals, one of the two terminals being electrically connected to the bias voltage and another being electrically connected to he second node of the first drain/source and the second gate in respective.

Yet, to achieve the above objects, the present invention further provides a driving circuit for a light emitting element, electrically connected to a data line and a scan line and powered by a bias voltage so as to drive the light emitting element, comprising:

a first transistor, further comprising: a first gate, electrically connected to the scan line; and a first drain/source, having a first node electrically connected to the data line and a second node;

a second transistor, further comprising: a second gate, electrically connected to the second node of the first drain/source; and a second drain/source, having a first node electrically connected to the bias voltage, and a second node electrically connected to the light emitting element;

wherein, an insulation layer and a layer of non-volatile material is formed successively between the semiconductor layer and the second gate of the second transistor.

In a preferred embodiment of the invention, the non-volatile material can be a ferroelectric material selected from the group consisting of Lead Zirconate Titanate (PZT) and Lead Scandium Tantalate (PST). Moreover, the light emitting element is a device selected from the group consisting of an Organic Light Emitting Diode (OLED), a Polymer Light Emitting Diode (PLED), and a Carbon Nanotube Field Emission Display (CNT-FED).

Other aspects and advantages of the present invention will become apparent from the following detailed description, taken in conjunction with the accompanying drawings, illustrating by way of example the principles of the present invention.

DESCRIPTION OF THE PREFERRED EMBODIMENT

For your esteemed members of reviewing committee to further understand and recognize the fulfilled functions and structural characteristics of the invention, several preferable embodiments cooperating with detailed description are presented as the follows.

Figure 1:
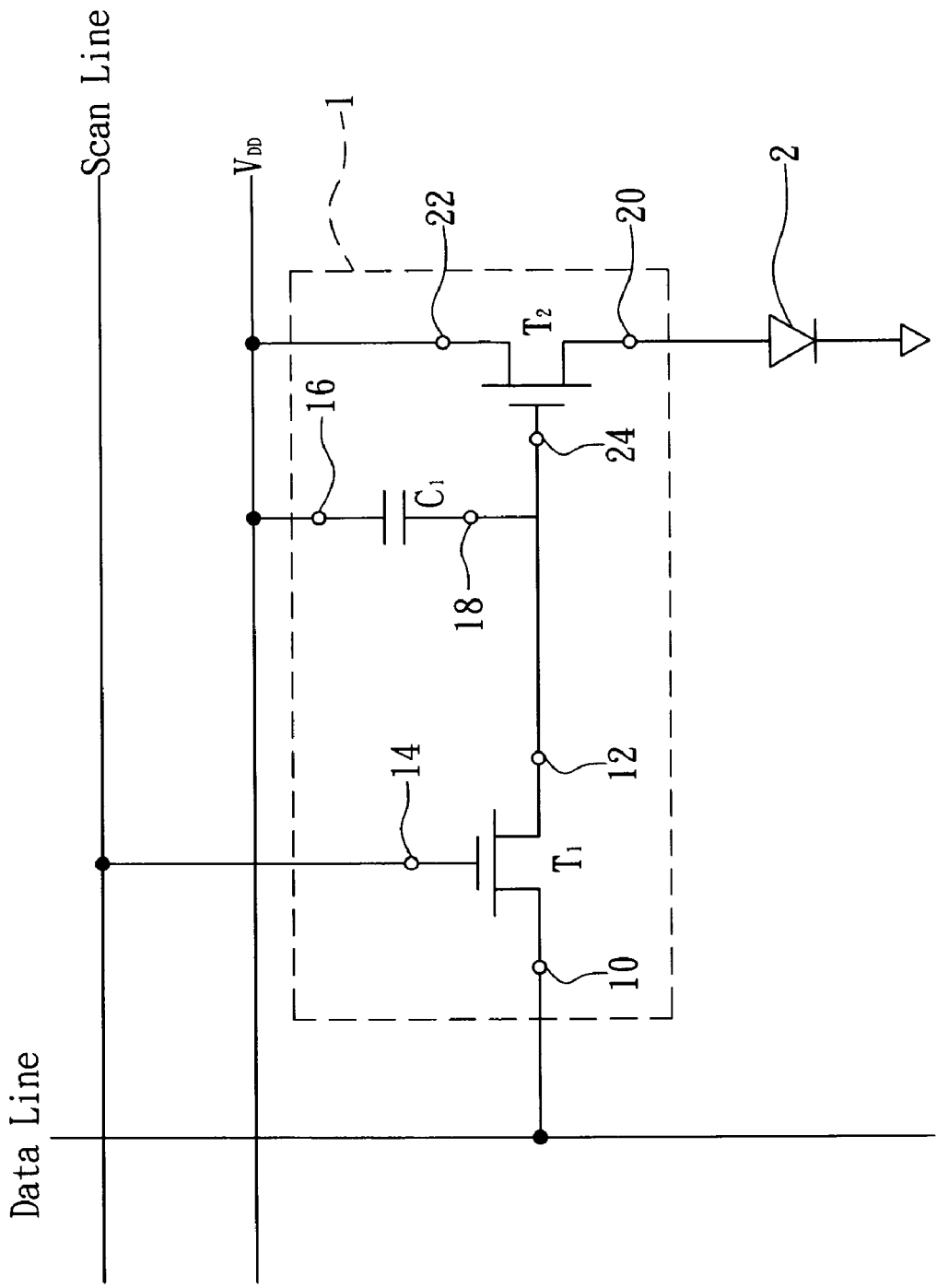
FIG. 1 is a schematic view of a driving circuit of light emitting element according to prior arts.
Figure 2:
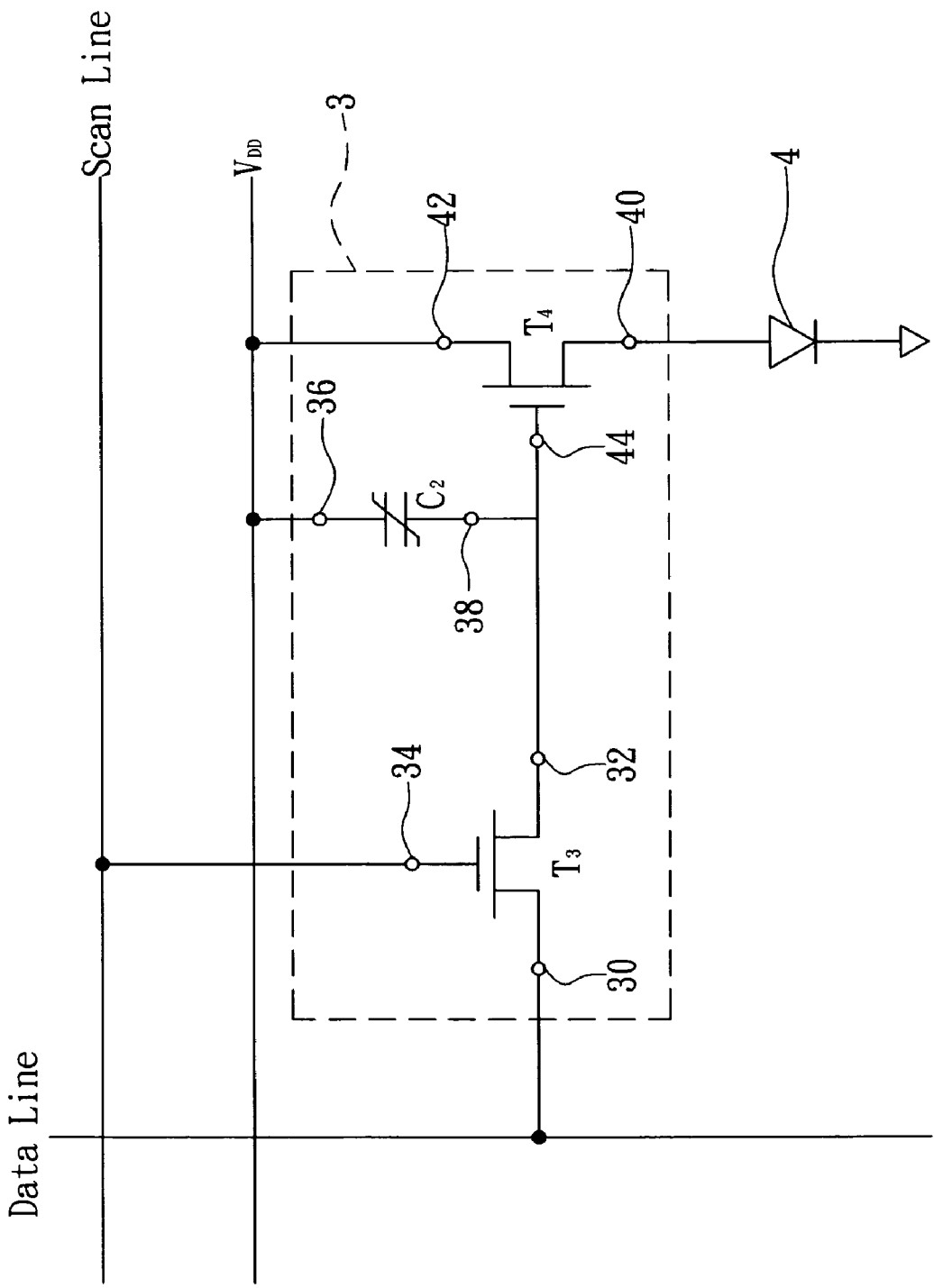
FIG. 2 is a schematic view of a driving circuit of light emitting element according to the first embodiment of the invention.

Please refer to FIG. 2, which is a schematic view of a driving circuit of light emitting element according to the first embodiment of the invention. Similar to that shown in FIG. 1, the driving circuit 3 is electrically connected to a data line and a scan line, that is powered by a bias voltage $V_{DD}$ so as to drive a light emitting element 4, wherein the data line is further connected to a data driver and the scan line is further connected to a scan driver. The driving circuit 3 further comprises two transistor $T_3$, $T_4$, and a capacitor $C_2$, wherein the gate 34 of the transistor $T_3$ is electrically connected to the scan line while a node 30 of the drain/source of the transistor $T_3$ is electrically connected to the data line, the gate 44 of the transistor $T_4$ is electrically connected to another node 32 of the drain/source of the transistor $T_3$ while a node 42 of the drain/source of the transistor $T_4$ is electrically connected to the bias voltage $V_{DD}$ and another node 40 thereof is electrically connected to the light emitting element 4. Moreover, a terminal 36 of the capacitor $C_2$ is electrically connected to the $V_{DD}$ while another terminal 38 thereof is electrically connected to the node 32 and the gate 44 in respective. The only difference between the FIG. 2 and the FIG. 1 is that the capacitor $C_2$ is made of a non-volatile material such as a ferroelectric material.

Using the hysteresis effect of the non-volatile material, the capacitor $C_2$ can ensure the electric connectivity of the channel of the transistor $T_4$ to last for a comparatively longer period such that the bias voltage $V_{DD}$ can be fed to the light emitting element 4 enabling the same to sustain illuminating. Therefore, the light emitting element 4 can maintain to illuminate for a comparatively longer period during displaying a static image without the requirement of activating the scan driver and the data driver to drive the light emitting element 4 during each scan, so that the power consumption can be saved.

Figure 3:
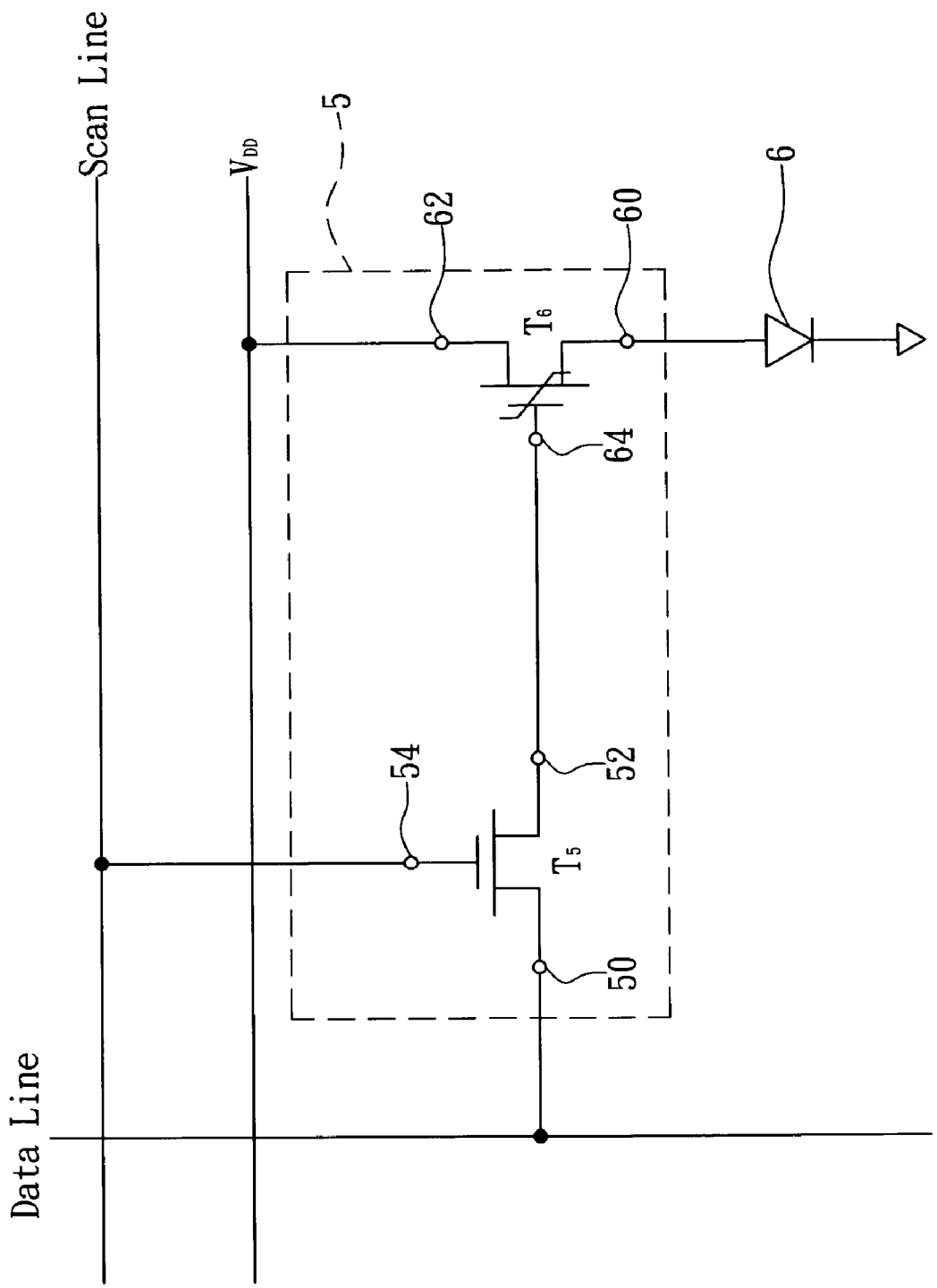
FIG. 3 is a schematic view of a driving circuit of light emitting element according to the second embodiment of the invention.

Please refer to FIG. 3, which is a schematic view of a driving circuit of light emitting element according to the second embodiment of the invention. The driving circuit 5 is electrically connected to a data line and a scan line, that is powered by a bias voltage $V_{DD}$ so as to drive a light emitting element 6, wherein the data line is further connected to a data driver and the scan line is further connected to a scan driver. The difference between the FIG. 3 and the FIG. 2 is that driving circuit 5 only comprises two transistors $T_5$, $T_6$, where transistor $T_6$ is made of a non-volatile material such as a ferroelectric material.

As seen in FIG. 3, the gate 54 of the transistor $T_5$ is electrically connected to the scan line while a node 50 of the drain/source of the transistor $T_5$ is electrically connected to the data line, the gate 64 of the transistor $T_6$ is electrically connected to another node 52 of the drain/source of the transistor $T_5$ while a node 62 of the drain/source of the transistor $T_6$ is electrically connected to the bias voltage $V_{DD}$ and another node 60 thereof is electrically connected to the light emitting element 6.

Figure 4:
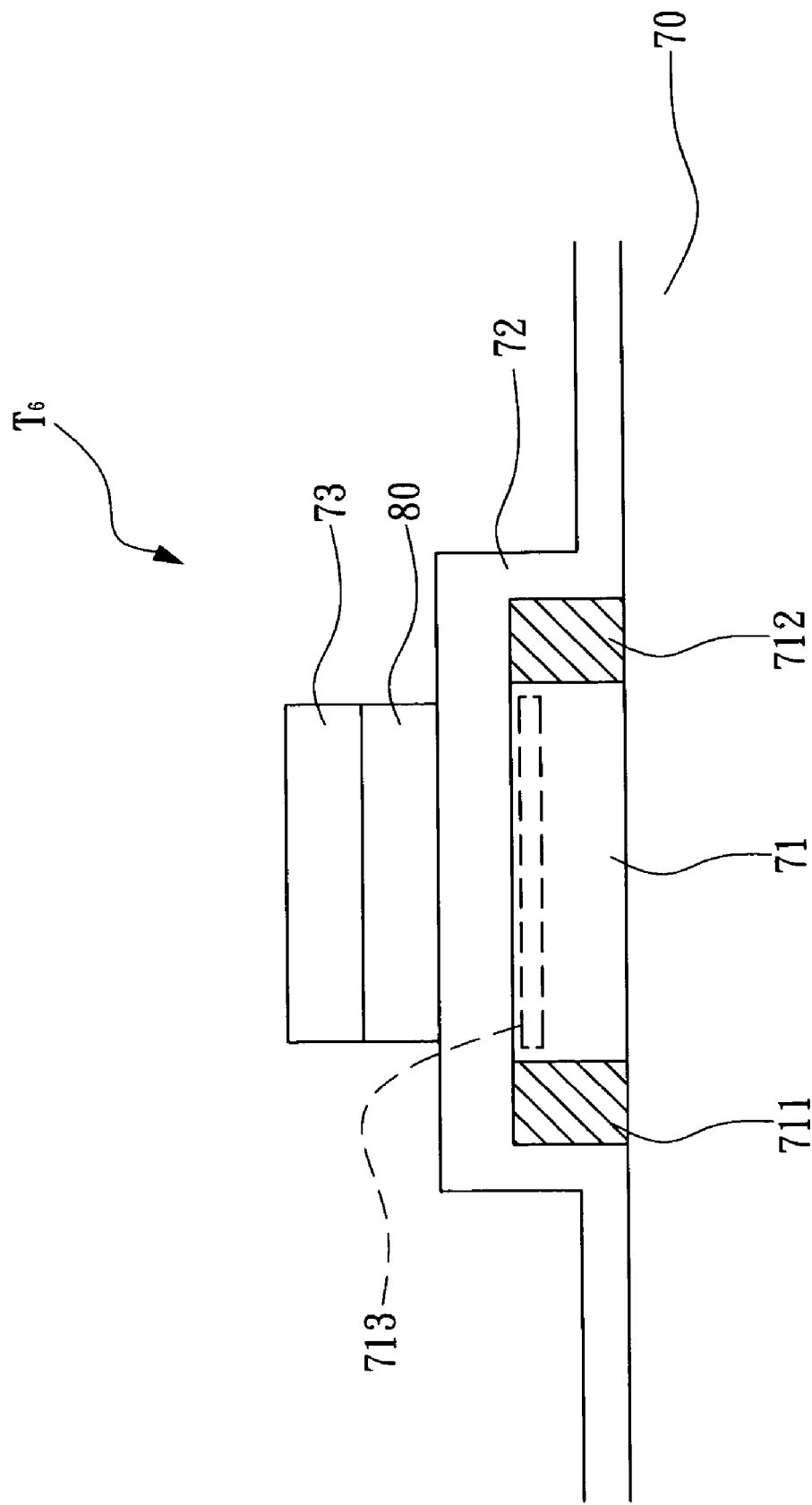
FIG. 4 is a cross-sectional view of a non-volatile capacitor used in the second embodiment of the invention.

Please refer to FIG. 4, which is a cross-sectional view of a non-volatile capacitor used in the second embodiment of the invention. The transistor $T_6$ is formed by successively stacking a substrate 70, a semiconductor layer 71, an insulation layer 72 and a conductive layer. The two ends of the semiconductor layer 71 are respectively a node 711 and another node 712, which act as the drain/source of the transistor $T_6$ while the conductive layer 73 acts as the gate of the transistor $T_6$. The difference sets apart the transistor $T_6$ from a common transistor is that transistor $T_6$ has a layer of non-volatile material 80 formed between the insulation layer 72 and the conductive layer.

Using the hysteresis effect of the non-volatile layer 80, the electric connectivity of the channel 713 of the transistor $T_6$ can last for a comparatively longer period such that the bias voltage $V_{DD}$ can be fed to the light emitting element 6 enabling the same to sustain illuminating. Therefore, the light emitting element 6 can maintain to illuminate for a comparatively longer period during displaying a static image without the requirement of activating the scan driver and the data driver to drive the light emitting element 6 during each scan, so that the power consumption can be saved.

In a preferred embodiment of the invention, the non-volatile material can be a ferroelectric material selected from the group consisting of Lead Zirconate Titanate (PZT) and Lead Scandium Tantalate (PST). Moreover, the light emitting element is a device selected from the group consisting of an Organic Light Emitting Diode (OLED), a Polymer Light Emitting Diode (PLED), and a Carbon Nanotube Field Emission Display (CNT-FED). In addition, since the driving circuit can do without requiring a capacitor as seen in the second embodiment of the invention, the aperture ratio of the display driven by the referring driving circuit can be increased and thus the displayed image quality is enhanced.

From the above description, it is noted that the driving circuit of the invention can ensure a static image to be display for a comparatively long period without the requirements of feeding data signals and scan signals all the time during the displaying, which is inventive and feasible.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A driving circuit for a light emitting element, electrically connected to a data line and a scan line and powered by a bias voltage so as to drive the light emitting element, comprising:

a first transistor, further comprising: a first gate, electrically connected to the scan line; and a first drain/source, having a first node electrically connected to the data line and a second node;

a second transistor, further comprising: a second gate, electrically connected to the second node of the first drain/source; and a second drain/source, having a first node electrically connected to the bias voltage, and a second node electrically connected to the light emitting element; and a capacitor, made of a non-volatile material with hysteresis effect for extending the time that the bias voltage powers to drive the light emitting element and reducing the amount of times that the data line and the scan line being driven to switch on/off during displaying a static image, having two terminals, one of the two terminals being electrically connected to the bias voltage and another being electrically connected to he second node of the first drain/source and the second gate in respective.

2. The driving circuit of claim 1, wherein the non-volatile material is a ferroelectric material.

3. The driving circuit of claim 2, wherein the ferroelectric material is Lead Zirconate Titanate (PZT).

4. The driving circuit of claim 2, wherein the ferroelectric material is Lead Scandium Tantalate (PST).

5. The driving circuit of claim 1, wherein the light emitting element is an Organic Light Emitting Diode (OLED).

6. The driving circuit of claim 1, wherein the light emitting element is a Polymer Light Emitting Diode (PLED).

7. The driving circuit of claim 1, wherein the light emitting element is a Carbon Nanotube Field Emission Display (CNT-FED).

8. A driving circuit for a light emitting element, electrically connected to a data line and a scan line and powered by a bias voltage so as to drive the light emitting element, comprising:

a first transistor, further comprising: a first gate, electrically connected to the scan line; and a first drain/source, having a first node electrically connected to the data line and a second node; and a second transistor, further comprising: a second gate, electrically connected to the second node of the first drain/source; and a second drain/source, having a first node electrically connected to the bias voltage, and a second node electrically connected to the light emitting element;

wherein, an insulation layer and a layer of non-volatile material with hysteresis effect for extending the time that the bias voltage powers to drive the light emitting element and reducing the amount of times that the data line and the scan line being driven to switch on/off during displaying a static image are formed successively between the semiconductor layer and the second gate of the second transistor.

9. The driving circuit of claim 8, wherein the non-volatile material is a ferroelectric material.

10. The driving circuit of claim 9, wherein the ferroelectric material is Lead Zirconate Titanate (PZT).

11. The driving circuit of claim 9, wherein the ferroelectric material is Lead Scandium Tantalate (PST).

12. The driving circuit of claim 8, wherein the light emitting element is an Organic Light Emitting Diode (OLED).

13. The driving circuit of claim 8, wherein the light emitting element is a Polymer Light Emitting Diode (PLED).

14. The driving circuit of claim 8, wherein the light emitting element is a Carbon Nanotube Field Emission Display (CNT-FED).

* * * * *